(12) United States Patent
Misiano et al.

(10) Patent No.: US 6,730,365 B2
(45) Date of Patent: May 4, 2004

(54) METHOD OF THIN FILM DEPOSITION UNDER REACTIVE CONDITIONS WITH RF OR PULSED DC PLASMA AT THE SUBSTRATE HOLDER

(76) Inventors: Carlo Misiano, Via Morgagni, 22, Rome (IT); Hans K. Pulker, Unterfeldwag, 22, Triesen (LI)

( * ) Notice: Subject to any disclaimer, the term of this patent is extended or adjusted under 35 U.S.C. 154(b) by 0 days.

(21) Appl. No.: 10/066,329

(22) Filed: Jan. 31, 2002

(65) Prior Publication Data

US 2002/0104483 A1 Aug. 8, 2002

(30) Foreign Application Priority Data

Feb. 6, 2001 (IT) .................................... RM2001A0060

(51) Int. Cl.[7] ................................................ B05D 3/06
(52) U.S. Cl. ....................... 427/551; 427/553; 427/570
(58) Field of Search ......................... 427/56, 551, 553, 427/570, 573

(56) References Cited

U.S. PATENT DOCUMENTS

| | | | | | |
|---|---|---|---|---|---|
| 4,058,638 | A | * | 11/1977 | Morton | 427/573 |
| 6,045,671 | A | * | 4/2000 | Wu et al. | 204/298.11 |
| 6,081,287 | A | * | 6/2000 | Noshita et al. | 347/203 |
| 6,315,873 | B1 | * | 11/2001 | Lowe et al. | 204/192.15 |

* cited by examiner

*Primary Examiner*—Bret Chen
(74) *Attorney, Agent, or Firm*—Herbert Dubno

(57) ABSTRACT

Method of thin film deposition especially in reactive conditions. Optical coatings with negligible optical absorption, of high quality and low cost even on unheated substrates are deposited using an RF/pulsed DC plasma RF/pulsed DC bias generates a plasma in front of the substrate. This plasma allows obtaining the right stoichiometry of the deposited film by increasing the reactivity of the reactive gas present in the plasma and, in addition, introduces an energetic ion bombardment of the substrate before and during the growth of the film which improves the adherence and the deposit compactness.

7 Claims, 2 Drawing Sheets

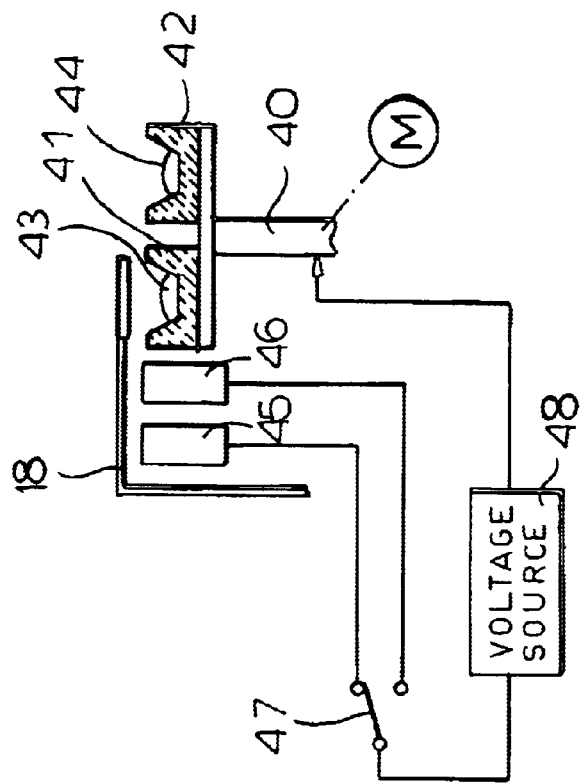
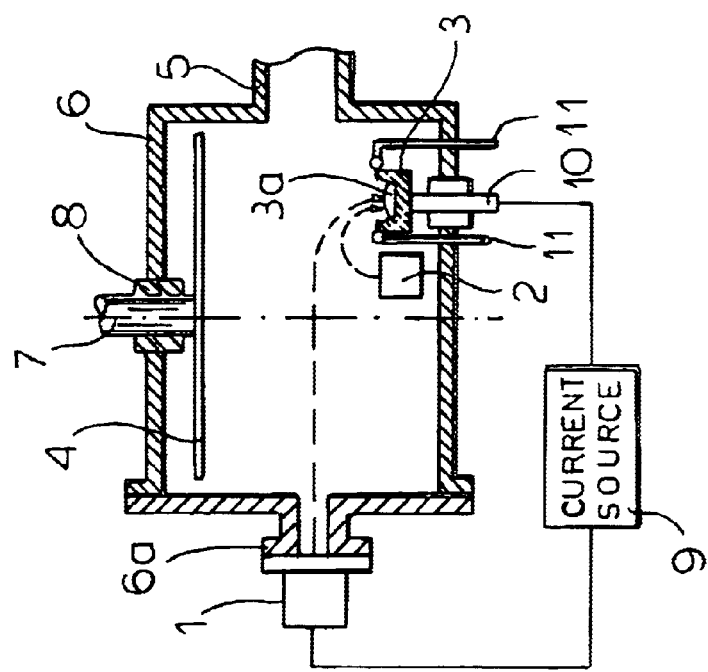
FIG. 3
FIG. 1

METHOD OF THIN FILM DEPOSITION UNDER REACTIVE CONDITIONS WITH RF OR PULSED DC PLASMA AT THE SUBSTRATE HOLDER

FIELD OF THE INVENTION

Our present invention relates to a method of and an apparatus for thin film deposition on a substrate and especially for applying an optical coating to a substrate with low absorption. More particularly, the invention relates to the application of thin film coatings by reactive deposition.

BACKGROUND OF THE INVENTION

A thin film coating method and apparatus are known from Swiss patent CH 928/85 and utilize an ion plating technique whereby material vaporization at least in part by an electron beam gun is ionized in a reactive environment formed by at least one gas admitted to the evacuatable reaction chamber and a resulting reaction production is thereby deposited on the substrate. The system utilizes low energy electron bombardment of the component in a crucible. The substrates tend to be electrically floating and are polarized under the conditions described in that patent at a bias voltage between –05 and –60 volts.

Experience with that system has shown that when efforts are made to deposit optical coatings, i.e. coatings with a relatively high refractive index, the coatings are at least partially absorbing. This drawback has limited the applicability of the coating method described in the Swiss patent and the optical losses which are associated with the absorption resulting from the coating has greatly limited the applicability of the method. This is especially the case for multilayer coatings. Indeed, it is impossible to use such coatings when a high laser damaged threshold is required for the product.

The absorption appears to be a result of the energetic ion bombardment of the material in the crucible and other ions present in the process atmosphere.

The method did permit highly compact films to be obtained even on substrates at low temperatures and with refractive indices of the coating which is close to the refractive index of the bulk material. The method also gave rise to coating layers which had excellent mechanical and environmental characteristics.

OBJECTS OF THE INVENTION

It is the principal object of the present invention to provide an improved method of coating a substrate with a thin film, especially an optical film, whereby drawbacks of the earlier systems are avoided.

It is another object of this invention to provide a thin film coating method whereby optical coatings of low absorption can be formed economically and reliably and with excellent mechanical and environmental properties.

It is also an object of this invention to provide an improved apparatus for applying thin film coatings to substrates.

SUMMARY OF THE INVENTION

These objects can be attained, in accordance with the invention, in a method which comprises the steps of:

(a) mounting a substrate to be coated on a substrate holder in an evacuatable chamber and so that the substrate is spacedly juxtaposed with a crucible containing a component of a coating to be applied to the substrate;

(b) evacuating the chamber;

(c) positioning a shutter between the crucible and the substrate and heating the component in the crucible with a high energy beam;

(d) admitting a gas mixture to the chamber;

(e) connecting the substrate holder to a radio frequency or pulsed direct current source so that the substrate holder is poled cathodic and a plasma is formed at least around the substrate to create a self bias of several hundreds of volts on the substrate holder and a surface of the substrate is bombarded with particles from the plasma;

(f) withdrawing the shutter from its position between the crucible and the substrate, bombarding the component with low energy electrons to ionize the component at least in part and depositing the component and the at least one gas on the substrate; and (g) controlling the ionization of the component so that the self bias is reduced by at least 50%.

Advantageously, the coating is carried out in a reactive mode, i.e. with the ionized components reacting with at least one gas in the gas mixture. The coatings which can be deposited can be oxides, nitrides, oxynitrides and carbides of substantially any component, usually a metal which can be melted and ionized in the crucible, including aluminum, tin, silver and chromium. Elemental metals may be deposited without reaction, for example, gold.

The apparatus which is used can comprise:

a vacuum chamber connectable to a pump adapted to evacuate the chamber;

at least one crucible in the chamber;

a substrate holder in the chamber receiving a substrate to be coated and juxtaposed with the crucible;

a mechanical shutter in the chamber interposable between the crucible and the substrate;

a high-energy source for heating a component of a coating to be deposited upon the substrate in the crucible;

a radio frequency or pulsed direct current source connectable to the substrate holder for producing a plasma around the substrate and imparting a self-bias to the substrate holder poling the substrate holder cathodic;

means for feeding a gas mixture to the chamber including at least one gas reactive with the component to form a coating on the substrate; and a low energy electron source for ionizing the component to reduce the self-bias and deposit a reaction product of the component and the at least one gas on the substrate, the shutter being movable from between the crucible and the substrate to permit ionization of the component.

The invention utilizes the plasma generated around the substrate and at the substrate holder by the radio frequency or pulsed direct current source connected to the cathodically poled substrate holder to produce a self-bias around and in front of the substrate or substrates which can vary from several tens of volts to many hundreds of volts and usually is at least several hundred volts. The gas which is used can include an inert gas like argon and reactive gases like oxygen and nitrogen or mixtures thereof and the plasma may be maintained at a pressure in the chamber of $10^{-3}$ to $10^{-2}$ Torr. The chamber is initially evacuated to about say $10^{-6}$ Torr before the gas mixture is admitted to the chamber.

The effects of the plasma are manifold and include:

ion bombardment from the plasma of the substrate surface usually by reactive gas molecules which appears to activate the surface and promote bonding of the thin film coating and mechanical integrity of the latter. The plasma also contributes to ionization and excitation of the reactive gas which tends to drive the reaction in the direction of formation of the reaction products and compensates for possible disassociation caused by energetic ion bombardment.

In addition, the plasma appears to bring about an ion bombardment of the growing film and hence a higher film compactness during its growth with a consequent improvement in adherence of the film to the substrate.

The plasma also contributes to an increase in the duration of the "adatom" phase which also results in an increase in compactness and mechanical stability of the film and a refractive index value which is close to that of the bulk material.

Finally it has been found, most surprisingly, that the presence of the plasma, coupled with the dramatic decrease in the self-bias brought about by ionization of the coating components, results in an increase in the maximum deposition rate without significant absorption so that the duration of the process can be reduced along with the processing cost.

The apparatus of the invention permits optical coatings to be applied to substrates without noticeable absorption of the film and a significant increase in the refractive index by comparison with the reactive indices of coatings applied with other apparatus even at higher deposition rates.

BRIEF DESCRIPTION OF THE DRAWING

The above and other objects, features, and advantages will become more readily apparent from the following description, reference being made to the accompanying drawing in which:

FIG. 1 is an axial section of a prior at arrangement;

FIG. 3 is a detail of a modification of the apparatus of FIG. 2.

SPECIFIC DESCRIPTION

Figure 2:
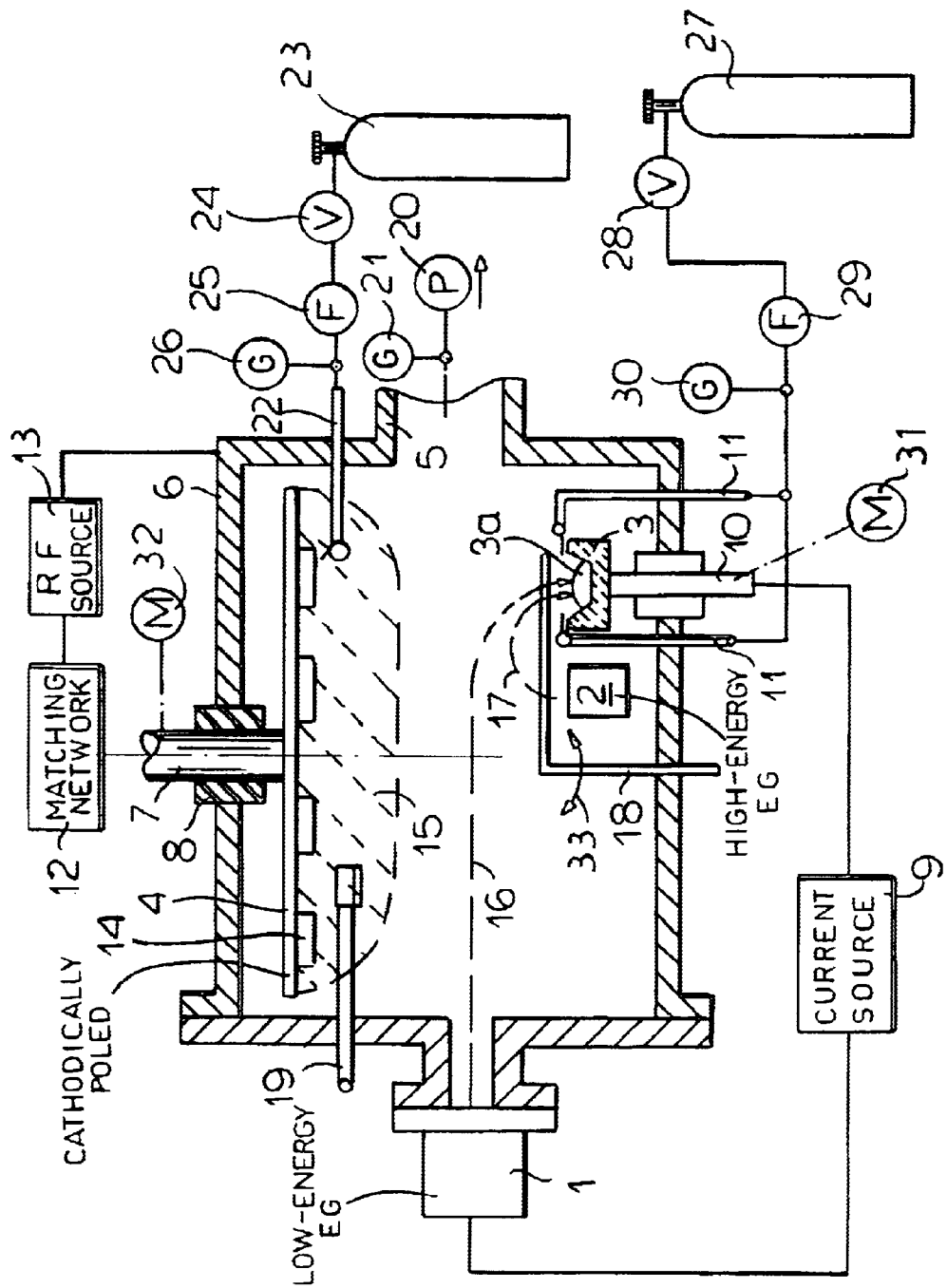
FIG. 2 is an axial section of an apparatus according to the invention.

The prior art apparatus shown in FIG. 1 comprises a vacuum chamber 6 which has a fitting 6a at one end connected to a low-energy electron generator 1. Within the chamber 6, which can be connected by a fitting 5 to a suction beam arrangement capable of reducing the pressure in the vacuum chamber 2, say $10^{-6}$ Torr, there is provided a high-energy electron generator 2 which can be an electron beam gun. A current source 9 is connected between the crucible holder 10 and the low-energy electron generator 1. Fittings 11 are provided to introduce process gas into the chamber and a substrate holder 4 is mounted on a shaft 7 extending through an insulator 8. As has been described previously, the workpiece may be provided on the substrate and is exposed to ions evaporated from the material 3a in the crucible 3 on the holder 10. The chamber 6 is evacuated and electron beam vaporization of the material 3a causes that material to react with the reactive component of the process gas introduced at 11 for deposition on the workpiece.

In FIG. 2, corresponding reference numerals have been used to represent elements in the system of FIG. 2 which are similar to those of FIG. 1. The chamber 6 here, connected to the suction beam 20 via the vacuum gauge 21, also has a process gas inlet 22 connected to the process gas source 23 by a valve 24, a flow meter 25 and a pressure gauge 26.

A similar process gas source 27 has a valve 28, a flow meter 29 and a pressure gauge 30 connecting it to the process gas inlets 11 which discharge at the mouth of the crucible 3.

The crucible holder 10 is rotatable by a motor 31 and the feed-through 7 in the insulator 8 is likewise rotatable, e.g. by a motor 32. The radio frequency source has been illustrated in FIG. 2 at 13 and is connected by the matching network 12 to the feed-through 7. The substrates 14 on the holder are blanketed in a plasma which has been represented at 15 and a monitor 19 is provided to measure the thickness of the coating on the substrate. A mechanical shutter 18 can be swung as represented by the double-headed arrow 33 so that in one position it covers the mouth of the crucible 3 and in another position is swung away from that mouth to allow vaporized material from the crucible to pass through the plasma 15 and deposit on the surface of the substrates 14 which may be lenses or the like to be coated with, for example, a tin oxide coating.

In the method of the invention, the substrates 14 are mounted on the rotatable holder 4 and after chemical cleaning externally are activated or further cleaned by plasma 15. The rotation of the substrate holder 7 ensures thickness uniformity and thin films on the substrate. While the substrate holder is shown in a horizontal orientation it could, of course, be vertically oriented as well.

Chamber 6 is evacuated through the fitting 5 via the suction pump 20 to a pressure of about $10^{-6}$ Torr. While the shutter is positioned in front of the source of coating ions as shown at 3, the metal 3a within the crucible is heated, e.g. by heating of the crucible electrically, and by the high-energy electron beam from the source 2, thereby melting the material to be vaporized.

The gaseous mixture, e.g. argon and at least one reactive gas, for example nitrogen or oxygen, is admitted through fitting 11 and the gas flow is controlled by the vacuum gauges and flow meters. One of the sources 23 or 27 may be provided with the reactive gas while the admitted argon or mixtures of argon and the reactive gas may be prepared and admitted through the same inlets.

The radio frequency source 13 is activated thereby generating the plasma 15 whose particles bombard the substrates 14 and further activate or "clean" the surfaces thereof. The self-bias of hundreds of volts is developed on the substrate holder.

In FIG. 3 crucible holder 40 has been shown and has crucibles 41 and 42 containing different materials 43, 44 which can be evaporated and the shutter 18 can cover the one in the active position. By rotation of the holder 40, the different crucibles can be brought into position. Multiple electron beam sources can be used as shown at 45 and 46 and can be selectively connected at 47 to the voltage source 48.

We claim:

1. A method of applying a thin film coating to a substrate, comprising the steps of:

(a) mounting a substrate to be coated on a substrate holder in an evacuatable chamber and so that said substrate is spacedly juxtaposed with a crucible containing a component of a coating to be applied to said substrate;

(b) evacuating said chamber;

(c) positioning a shutter between said crucible and said substrate and heating said component in said crucible with a high energy electron beam;

(d) admitting a gas mixture to said chamber containing at least one gas reactive with said component to form said coating;

(e) connecting said substrate holder to a radio frequency or pulsed direct current source so that said substrate holder is poled cathodic and a plasma is formed at least around said substrate to create a self bias of several hundreds of volts on said substrate holder and a surface of said substrate is bombarded with particles from the plasma;

(f) withdrawing said shutter from its position between said crucible and said substrate, bombarding said component with low energy electrons from a low-energy electron source independent of said high energy electron beam to ionize said component at least in part and depositing a reaction product of said component and said at least one gas on said substrate; and (g) controlling the ionization of said component so that said self bias is reduced by at least 50%.

2. The method defined in claim 1 wherein said self bias and said plasma are produced by connecting said substrate holder to a radio frequency source.

3. The method defined in claim 2 wherein the deposition of said coating is monitored and the coating is terminated when a predetermined thickness of the coating is reached.

4. The method defined in claim 1 wherein said thin film coating is an optical coating.

5. The method defined in claim 1, further comprising the step of depositing a reaction product of a component from another crucible and said at least one gas on said substrate following the deposition of said coating thereon.

6. The method defined in claim 1, further comprising the step of directing another electron beam from an electron beam gun onto said component in said crucible.

7. A method of applying a thin film coating to a substrate, comprising the steps of:

(a) mounting a substrate to be coated on a substrate holder in an evacuatable chamber and so that said substrate is spacedly juxtaposed with a crucible containing a component of a coating to be applied to said substrate;

(b) evacuating said chamber;

(c) positioning a shutter between said crucible and said substrate and heating said component in said crucible with a high energy electron beam;

(d) admitting a gas mixture to said chamber;

(e) connecting said substrate holder to a radio frequency or pulsed direct current source so that said substrate holder is poled cathodic and a plasma is formed at least around said substrate to create a self bias of several hundreds of volts on said substrate holder and a surface of said substrate is bombarded with particles from the plasma;

(f) withdrawing said shutter from its position between said crucible and said substrate, bombarding said component with low energy electrons to ionize said component at least in part and depositing said component and said at least one gas on said substrate; and (g) controlling the ionization of said component so that said self bias is reduced by at least 50%.

* * * * *